(12) United States Patent
Kawanobe et al.

(10) Patent No.: US 7,888,697 B2
(45) Date of Patent: Feb. 15, 2011

(54) LEAD FRAME, METHOD OF MAKING THE SAME AND LIGHT RECEIVING/EMITTING DEVICE

(75) Inventors: Tadashi Kawanobe, Hitachi (JP); Yuichi Ohnuma, Hitachi (JP); Mamoru Mita, c/o Hitachi Cable Precision Co., Ltd., 1-1, Sukegawa-cho 3-chome, Hitachi-shi, Ibaraki (JP)

(73) Assignees: Hitachi Cable Precision Co., Ltd., Hitachi-shi (JP); Mamoru Mita, Hitachi-shi (JP)

( * ) Notice: Subject to any disclaimer, the term of this patent is extended or adjusted under 35 U.S.C. 154(b) by 0 days.

(21) Appl. No.: 12/326,628

(22) Filed: Dec. 2, 2008

(65) Prior Publication Data

US 2009/0141498 A1 Jun. 4, 2009

(30) Foreign Application Priority Data

Dec. 3, 2007 (JP) .............................. 2007-311975

(51) Int. Cl.
*H01L 33/00* (2010.01)
(52) U.S. Cl. ............................ 257/98; 257/99; 257/100; 257/666; 257/680; 257/E33.066; 257/E33.067; 257/E33.072
(58) Field of Classification Search ................. 257/666, 257/98, 99, 100, 680, E33.066, E33.067, 257/E33.072
See application file for complete search history.

(56) References Cited

U.S. PATENT DOCUMENTS 4,027,326 A * 5/1977 Kummer et al. ............... 257/46
5,841,187 A * 11/1998 Sugimoto et al. ............. 257/666
6,222,207 B1 * 4/2001 Carter-Coman et al. ........ 257/98
6,531,328 B1 * 3/2003 Chen ............................ 438/26
6,583,444 B2 * 6/2003 Fjelstad ....................... 257/82
6,642,609 B1 * 11/2003 Minamio et al. ............. 257/666
6,777,069 B2 * 8/2004 Ito et al. .................. 428/322.2
6,929,864 B2 * 8/2005 Fleming et al. ............. 428/457
7,205,626 B1 * 4/2007 Nakata ........................ 257/461
7,329,942 B2 * 2/2008 Tsou et al. ................... 257/594
7,530,718 B2 5/2009 Ono
2004/0140539 A1 * 7/2004 Abbott ........................ 257/666
2007/0262336 A1 * 11/2007 Tamaki et al. ................. 257/98
2009/0078956 A1 * 3/2009 Tseng et al. ................... 257/98

FOREIGN PATENT DOCUMENTS

| JP | 2007-109915 A | 4/2007 |
|----|---------------|--------|
| JP | 3940124 B2 | 4/2007 |
| JP | 2007-265909 A | 10/2007 |

* cited by examiner

*Primary Examiner*—Davienne Monbleau
*Assistant Examiner*—Eduardo A Rodela
(74) *Attorney, Agent, or Firm*—Foley & Lardner LLP

(57) ABSTRACT

A lead frame includes a base material, a reflection layer formed on a part of the base material, and a characteristic sustaining layer formed at least on the reflection layer to cover the reflection layer for sustaining a characteristic of the reflection layer by isolating the reflection layer from an outside. The reflection layer includes the characteristic to exhibit a predetermined reflectivity to light with a predetermined wavelength, and the characteristic sustaining layer prevents a decrease in the reflectivity of the reflection layer and transmits light reflected by the reflection layer.

21 Claims, 7 Drawing Sheets

FIG. 7

LEAD FRAME, METHOD OF MAKING THE SAME AND LIGHT RECEIVING/EMITTING DEVICE

The present application is based on Japanese Patent Application No. 2007-311975 filed on Dec. 3, 2007, the entire contents of which are incorporated herein by reference.

BACKGROUND OF THE INVENTION

1. Field of the Invention

The present invention relates to a lead frame and, in particular, to a lead frame that deterioration in characteristics thereof can be suppressed even after long-term use, a method of making the lead frame and a light receiving/emitting device using the lead frame.

2. Related Art

A lead frame used for a conventional semiconductor device is known in which a silver coating as a reflection region is formed on an outermost layer at a portion of a region surrounded by an enclosure (or reflector) and a gold or gold alloy coating is formed on an outermost layer at a region except the silver coating (e.g., Japanese patent No. 3940124). When the lead frame in Japanese patent No. 3940124 is used for mounting, e.g., a light-emitting device thereon, light emitted from the light-emitting device toward the lead frame can be efficiently reflected on the region with the silver coating to enhance the emission efficiency.

However, when the silver coating of the lead frame in Japanese patent No. 3940124 is exposed outside before mounting the light emitting device, a problem may arise that the reflectivity of the silver lowers due to sulfuration and/or oxidation. Furthermore, a problem may arise that, even when the inside of the enclosure is filled by a sealing resin after mounting the light-emitting device, the silver coating is sulfurated and/or oxidized by sulfur and/or oxygen penetrated through the resin due to long-term use (e.g., about one year use), so that the reflectivity of the silver coating significantly lowers.

SUMMARY OF THE INVENTION

It is an object of the invention to provide a lead frame that deterioration in characteristics thereof can be suppressed even after long-term use, a method of making the lead frame and a light receiving/emitting device using the lead frame.

(1) According to one embodiment of the invention, a lead frame comprises:
a base material;
a reflection layer formed on a part of the base material; and
a characteristic sustaining layer formed at least on the reflection layer to cover the reflection layer for sustaining a characteristic of the reflection layer by isolating the reflection layer from an outside.

In the above embodiment (1), the following modifications and changes can be made.

(i) The reflection layer comprises the characteristic to exhibit a predetermined reflectivity to light with a predetermined wavelength, and
the characteristic sustaining layer prevents a decrease in the reflectivity of the reflection layer and transmits light reflected by the reflection layer.

(ii) The reflection layer comprises Ag, and
the characteristic sustaining layer comprises an inorganic material.

(iii) The inorganic material comprises one of a fluorine-based material and a silicone-based material.

(iv) The reflection layer comprises Ag, and
the characteristic sustaining layer comprises an organic material.

(v) The organic material comprises one of a triazole-based material and a mercaptan-based material.

(vi) The reflection layer comprises Ag, and
the characteristic sustaining layer comprises an Au thin film.

(vii) The characteristic sustaining layer is integrated with the reflection layer to form an alloy of Ag composing the reflection layer and Au composing the Au thin film.

(viii) The characteristic sustaining layer comprises the Au thin film and an alloy layer formed from the Au thin film and the reflection layer.

(ix) The characteristic sustaining layer comprises a device mounting region contacting a semiconductor device and an external region formed on an outside of the device mounting region, and
the device mounting region is formed on a part of the reflection layer.

(x) The device mounting region is integrated with the external region.

(xi) The device mounting region is formed independently from the external region.

(2) According to another embodiment of the invention, a method of making a lead frame comprises:
forming a reflection layer on a part of a base material; and
forming a characteristic sustaining layer formed at least on the reflection layer to cover the reflection layer for sustaining a characteristic of the reflection layer by isolating the reflection layer from an outside.

(3) According to another embodiment of the invention, a light emitting device comprises:
the lead frame according to the embodiment (1);
a light emitting element mounted on the lead frame; and
a sealing member for sealing the light emitting device.

(4) According to another embodiment of the invention, a light receiving device comprises:
the lead frame according to the embodiment (1);
a light receiving element mounted on the lead frame; and
a sealing member for sealing the light receiving element.

BRIEF DESCRIPTION OF THE DRAWINGS

Next, the present invention will be explained in more detail in conjunction with appended drawings, wherein.

DESCRIPTION OF THE PREFERRED EMBODIMENTS

Next, preferred embodiments according to the present invention will be explained in conjunction with appended drawings.

First Embodiment

Figure 1:
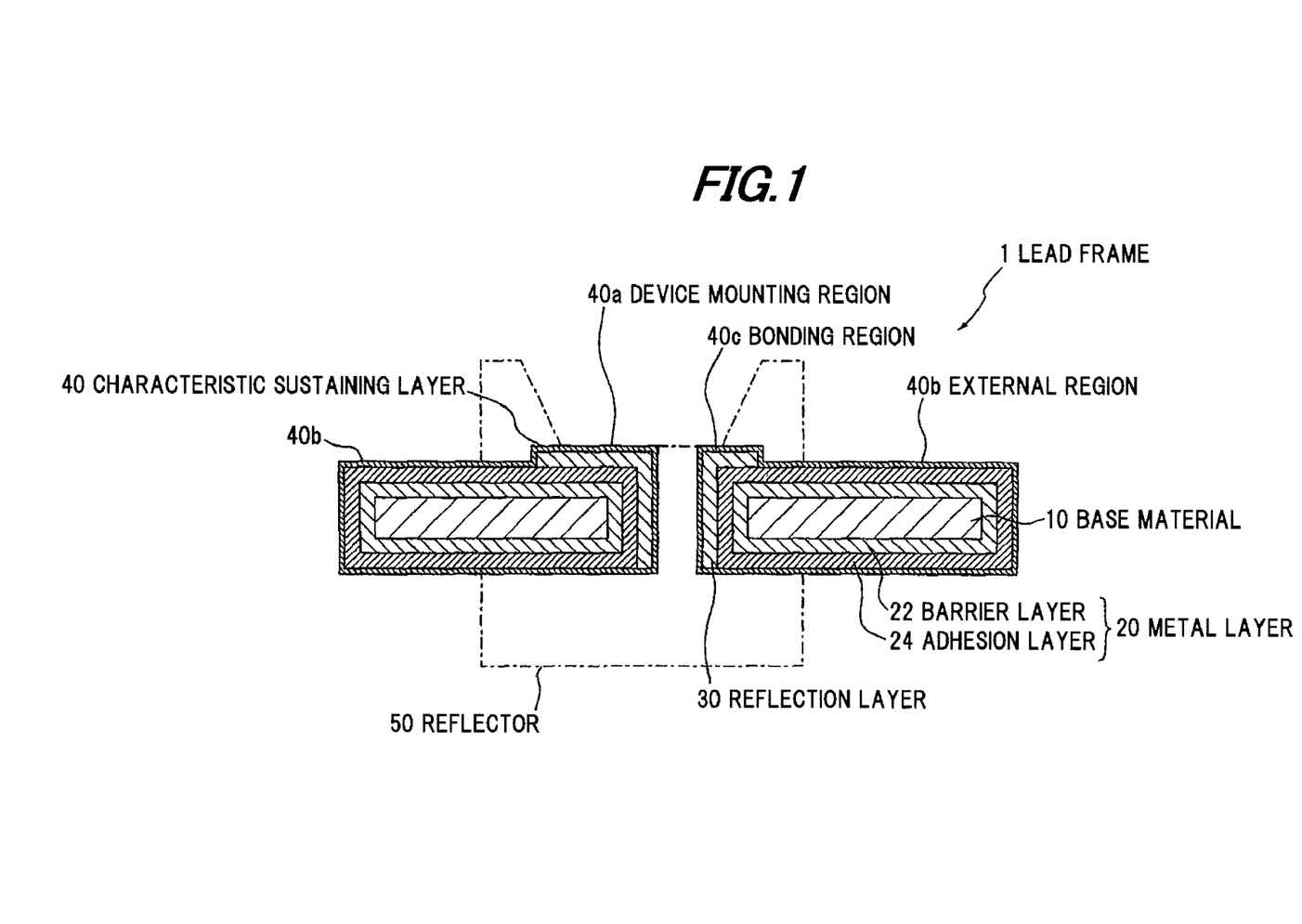
FIG. 1 is a cross sectional view showing a lead frame in a first preferred embodiment of the invention.

FIG. 1 is a cross sectional view showing a lead frame in a first embodiment of the invention.

Construction of Lead Frame 1

A lead frame 1 in the first embodiment of the invention is composed of a base material 10 formed of a material for a lead frame, a metal layer 20 formed on the surface of the base material 10, a reflection layer 30 formed on a part of the surface of the metal layer 20, and a characteristic sustaining layer 40 formed on the reflection layer 30 and on the metal layer 20 where the reflection layer 30 is not formed. Further, the metal layer 20 in the embodiment has a barrier layer 22 formed on the surface of the base material 10 and an adhesion layer 24 formed between the barrier layer 22 and the reflection layer 30 as well as the characteristic sustaining layer 40. Then, the characteristic sustaining layer 40 has a device mounting region 40a for mounting a semiconductor device, an external region 40b formed on outside of the device mounting region 40a and a bonding region 40c electrically connected to the semiconductor device by a wire. A reflector 50 is provided in a region indicated by a dashed line.

The base material 10 is formed of a thin plate as a material for a lead frame for mounting a semiconductor device such as a light-emitting device etc. The base material 10 is formed by pressing or etching a thin plate formed of, e.g., a metal material, and processed, e.g., 0.1 mm to 1.0 mm in thickness. The metal material for the base material 10 is a metal material having predetermined thermal conductivity and predetermined electrical conductivity, e.g., copper or copper alloy. Alternatively, the base material 10 can be formed of iron or the like. The light-emitting device is, e.g., a light emitting diode (LED) that emits light in a predetermined range of wavelengths ranging from ultraviolet region to infrared region. Alternatively, the semiconductor device may be a light-receiving device having a light receiving sensitivity to light with a predetermined wavelength.

The barrier layer 22 is formed as a foundation layer with a predetermined thickness on the surface of the base material 10. The barrier layer 22 covers the substantially whole surface of the base material 10. The barrier layer 22 controls or prevents an element composing the base material 10 from propagating in a surface direction opposite to the surface of the barrier layer 22 which contacts the base material 10. The barrier layer 22 is formed of, e.g., nickel. In detail, the barrier layer 22 is a Ni-plated layer formed on the base material 10 by Ni plating, e.g., formed 0.1 µm to 2.0 µm in thickness.

The adhesion layer 24 is formed with a predetermined thickness on the surface of the barrier layer 22. The adhesion layer 24 covers the substantially whole surface of the barrier layer 22. The barrier layer 22 is formed of a material having excellent corrosion resistance as well as chemical stability, e.g., formed of palladium (Pd). Specifically, the adhesion layer 24 is a Pd-plated layer formed by applying Pd plating to the barrier layer 22. As an example, the adhesion layer 24 is formed 0.01 µm to 0.5 µm in thickness.

The reflection layer 30 is a metal layer which is formed at a part of the surface of the adhesion layer 24 and reflects light in a predetermined wavelength range at a predetermined reflectivity. The reflection layer 30 is formed in a region on a mounting side of the semiconductor device, including a region for mounting the semiconductor device and corresponding to an area including at least a part in a radiation range of light emitted from the semiconductor device. For example, when a surface of the lead frame 1 for mounting the semiconductor device is defined as a front face and a surface opposite to the front face for mounting the semiconductor device is defined as a reverse face, the reflection layer 30 is formed at a part of the front face corresponding to the device mounting region 40a and the bonding region 40c and on an edge face of a separated portion formed in the vicinity of a substantially center of the lead frame 1 for separating the device mounting region 40a and the bonding region 40c. In this regard, however, the reflection layer 30 is not necessarily formed on the edge face. In other words, it may be sufficient to form the reflection layer 30 in the embodiment on at least a part of the front face corresponding to the device mounting region 40a and the bonding region 40c.

The reflection layer 30 in the embodiment is formed of a material exhibiting good reflectivity to a wavelength of light emitted from the light-emitting device as a semiconductor device. For example, the reflection layer 30 is formed of a metal material exhibiting high reflectivity to light with a wavelength in ultraviolet region and blue region. Concretely, the reflection layer 30 is formed of Ag which exhibits a reflectivity of about more than 95% to light with a wavelength of 400 nm to 800 nm. More concretely, the reflection layer 30 is an Ag-plated layer formed by plating a part of the adhesion layer 24, e.g., formed 0.5 µm to 20 µm in thickness. The Ag-plated layer formed as the reflection layer 30 may be formed as a brilliant or mat Ag-plated layer, or an Ag layer having predetermined density.

The characteristic sustaining layer 40 is provided in a predetermined thickness on at least the reflection layer 30 so as to cover the reflection layer 30. The characteristic sustaining layer 40 prevents the reflection layer 30 from directly contacting the outside by coating the reflection layer 30. In addition, the characteristic sustaining layer 40 sustains the characteristics of the reflection layer 30 by isolating the reflection layer 30 from the outside by coating the reflection layer 30. In other words, the characteristic sustaining layer 40 prevents change of the characteristics of the reflection layer 30 due to sulfuration or oxidation by preventing the reflection layer 30 from contacting sulfur and/or oxygen existing in the surrounding such as an atmosphere, or in the air.

Concretely, the characteristic sustaining layer 40 in the embodiment prevents decrease of the reflectivity of the reflection layer 30. In addition, the characteristic sustaining layer 40 transmits light reflected by the reflection layer 30 or at least propagates most part of light of a wavelength reflected by the reflection layer 30 without absorbing. In other words, the characteristic sustaining layer 40 is formed of a material substantially transparent to light reflected by the reflection layer 30, or formed in a thickness to be substantially transparent to light reflected by the reflection layer 30. Note that, since the characteristic sustaining layer 40 prevents the reflection layer 30 from contacting the outside, it is also possible to prevent the change of characteristics of the reflection layer 30 such as a mechanical strength, thermal conductivity and electrical conductivity etc.

The characteristic sustaining layer 40 in the embodiment is a metal layer formed of, e.g., gold (Au) or an Au alloy. Specifically, the characteristic sustaining layer 40 is an Au-plated layer, preferably an Au flash-plated layer as an Au thin film. The Au flash-plated layer as the characteristic sustaining layer 40 is formed in a thickness of about one-tenth or less of the wavelength of light reflected by the reflection layer 30, so that light reflected by the reflection layer 30 is substantially transmitted. For example, when the reflection layer 30 reflects light from an ultraviolet region to a blue region (or a blue-green region), the Au flash-plated layer as the characteristic sustaining layer 40 is formed from 0.0001 μm to 0.05 μm in thickness. The thickness of the Au flash-plated layer as the characteristic sustaining layer 40 can be determined in accordance with the wavelength of light to be reflected by the reflection layer 30.

The device mounting region 40a is a portion of the characteristic sustaining layer 40 on the front face side of the lead frame 1, and is a region for mounting the semiconductor device. In detail, the device mounting region 40a is formed on a portion of the front face of the lead frame 1, includes a region for mounting the semiconductor device and is at least larger than the region that the semiconductor device contacts with the reflection layer 30. Meanwhile, the bonding region 40c is a portion of the characteristic sustaining layer 40 on the front face side of the lead frame 1, and is a region in which an edge of a power supply wire is electrically connected to the semiconductor device. In addition, the external region 40b is a portion of the characteristic sustaining layer 40 on the front face side of the lead frame 1, and is a region formed on the outside of the device mounting region 40a and the bonding region 40c. Here, in the first embodiment, the device mounting region 40a, the external region 40b and the bonding region 40c are formed as a unit.

Alternatively, the Au flash-plated layer as the characteristic sustaining layer 40 in the modification of the embodiment may be formed in a thickness that the Au flash-plated layer is integrated with the reflection layer 30 when the Au flash-plated layer reacts in solid phase with Ag composing the reflection layer 30. For example, when predetermined heat treatment (e.g., at 230° C. for 30 minutes) is applied to the lead frame 1 in a process for mounting the semiconductor device on the lead frame 1, Au composing the Au flash-plated layer diffuses into Ag composing the reflection layer 30 in solid phase. Thereby, Au in the Au flash-plated layer is alloyed with Ag. The Au flash-plated layer may be formed in a thickness that the Au flash-plated layer is integrated with the reflection layer 30 by alloying Au in the Au flash-plated layer with Ag in the reflection layer 30 in consideration of the solid phase diffusion. In other wards, an Au flash-plated layer with a thickness of a degree such that the Au flash-plated layer is not recognized as a single body may be formed by alloying Au in the Au flash-plated layer with Ag in the reflection layer 30.

In addition, the Au flash-plated layer as the characteristic sustaining layer 40 in another modification of the embodiment may include an alloy layer containing Au and Ag at an interface between the Au flash-plated layer and the reflection layer 30. Namely, an alloy layer formed by alloying a portion of the Au flash-plated layer with a portion of the reflection layer 30 may be formed at the interface between the Au flash-plated layer and the reflection layer 30.

The reflector 50 indicated by a dashed line in FIG. 1 has a concave portion on a side where the semiconductor device is mounted (surface of the reflector 50), and a bottom on a reverse side of the reflector 50. The reflector 50 is formed of an insulating resin or ceramic material having predetermined thermal resistance and a predetermined mechanical strength, or a composite material thereof. When the reflector 50 is formed of a resin material, the reflector 50 is formed by resin molding.

Figure 2A:
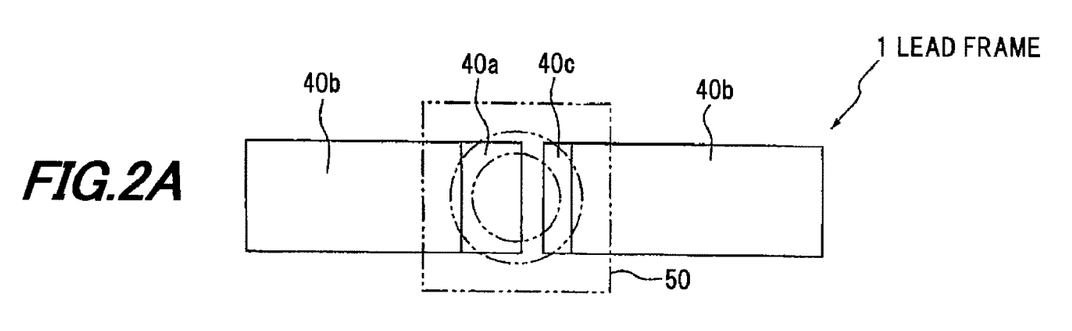
FIG. 2A is a schematic top view showing the lead frame in the first embodiment.
Figure 2B:
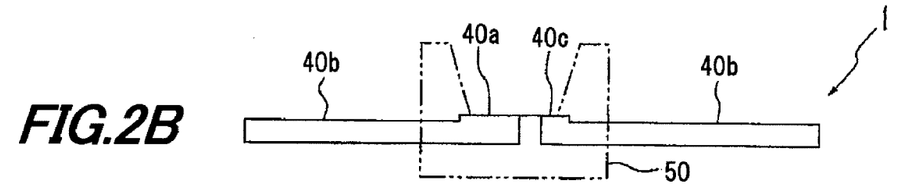
FIG. 2B is a schematic side view showing the lead frame in the first embodiment.
Figure 2C:
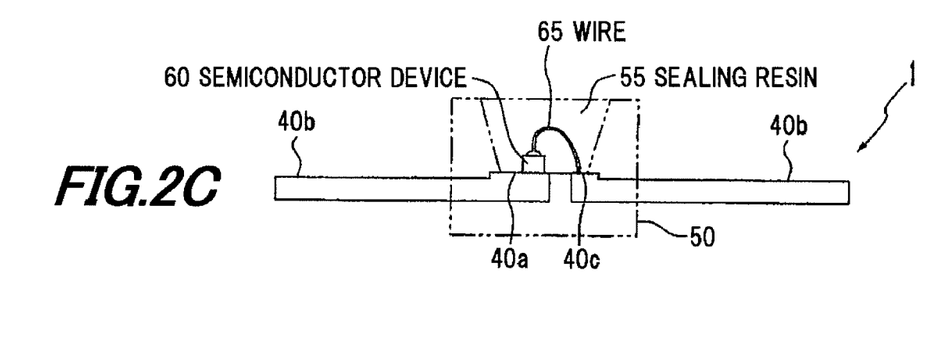
FIG. 2C is a schematic side view showing a state that a semiconductor device is mounted on the lead frame in the first embodiment.

FIG. 2A is a schematic top view showing the lead frame in the first embodiment of the invention, FIG. 2B is a schematic side view showing the lead frame in the first embodiment and FIG. 2C is a schematic side view showing a state that a semiconductor device is mounted on the lead frame in the first embodiment.

As shown in FIGS. 2A and 2B, the lead frame 1 in the embodiment has the device mounting region 40a larger than the bonding region 40c. Alternatively, in a modification of the embodiment, it is possible to form the device mounting region 40a and the bonding region 40c so that a dimension of the device mounting region 40a is substantially same as that of the bonding region 40c. In the embodiment, the device mounting region 40a and the bonding region 40c are formed in a substantially rectangular shape from top view. Alternatively, in the modification of the embodiment, the device mounting region 40a and the bonding region 40c may be formed in a substantially polygonal shape, or in a shape partially having a circular arc with a predetermined curvature.

Then, as shown in FIG. 2C, when a light-emitting device is made by using the lead frame 1, a semiconductor device 60 such as a LED, etc. is mounted of the device mounting region 40a. The semiconductor device 60 is fixed to the device mounting region 40a of the lead frame 1 using, e.g., an electrically conductive adhesive such as an Ag paste, etc. or an alloy material such as AuSn, etc. Subsequently, a top electrode of the semiconductor device 60 is electrically connected to the bonding region 40c by a wire 65 formed of a metal material such as an Au wire or the like. In the first embodiment, since the characteristic sustaining layer 40 is formed of the Au flash-plated layer, the bonding characteristic of the semiconductor device 60 is enhanced as compared to the case that the semiconductor device 60 is directly mounted on the reflection layer 30.

In addition, a resin sealant for sealing the semiconductor device 60 and the wire 65 is filled in the concave portion of the reflector 50. The resin sealant is cured by the predetermined heat treatment. A sealing resin 55 such as e.g., an epoxy resin and a silicone resin, etc. is used for the resin sealant. In addition, it is possible to disperse the sealing resin 55 by adding a predetermined phosphor for converting light emitted from the semiconductor device 60 into light with a different wavelength. For the phosphor, it is possible to use an oxide-based phosphor or a nitride-based phosphor. For example, when excited by light with a wavelength in the blue region, a yellow phosphor (e.g., a YAG phosphor) emitting yellow light with a peak wavelength in a yellow region can be added to the sealing resin 55. A low-melting-point glass material may be used instead of the sealing resin 55.

Figure 3A:
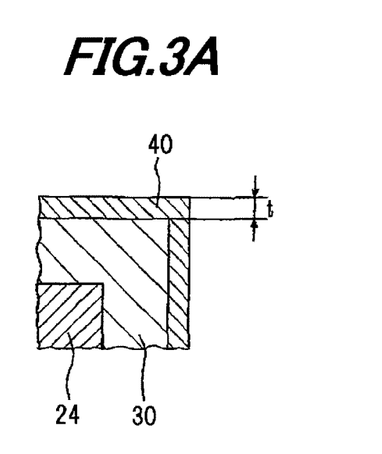
FIG. 3A is an enlarged view showing an interface where a characteristic sustaining layer in a modification of the first embodiment contacts a reflection layer.
Figure 3B:
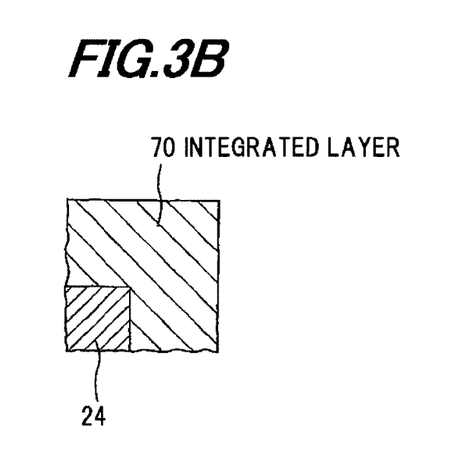
FIG. 3B is an enlarged view showing a state that the characteristic sustaining layer in the modification of the first embodiment is alloyed with the reflection layer.

FIG. 3A is an enlarged view showing an interface where a characteristic sustaining layer in a modification of the first embodiment contacts the reflection layer, and FIG. 3B is an enlarged view showing the state that the characteristic sustaining layer in the modification of the first embodiment is alloyed with the reflection layer.

First, as shown in FIG. 3A, the characteristic sustaining layer 40 is independently formed on the reflection layer 30 in the state that the Au flash-plated layer as the characteristic sustaining layer 40 is formed on the reflection layer 30. Namely, the reflection layer 30 exhibits a property as Ag and the characteristic sustaining layer 40 exhibits a property as Au. Note that, the thickness of the characteristic sustaining layer 40 is represented by "t" in FIG. 3A.

The reflection layer 30 is formed of Ag and the characteristic sustaining layer 40 is formed of Au. Here, a solid-phase diffusion rate of Ag into Au is very fast as known that a wire bonding of an Au wire on Ag plating is completed in few seconds. Therefore, when heat treatment is conducted to the lead frame 1 under a predetermined temperature for a predetermined time in the state that the characteristic sustaining layer 40 contacts the reflection layer 30, the characteristic sustaining layer 40 is bonded (solid-phase diffusion bonding) to the reflection layer 30 by alloying of Au and Ag by interdiffusion between Au and Ag.

The characteristic sustaining layer 40 in the modification of the first embodiment is formed in such a thickness that the characteristic sustaining layer 40 contacting at least the reflection layer 30 is integrated with the reflection layer 30 by the interdiffusion between Au and Ag to form an integrated layer 70. As a result, as shown in FIG. 3B, the integrated layer 70 is formed that the reflection layer 30 is integrated with the characteristic sustaining layer 40 by alloying. As compared to the reflection layer 30, the integrated layer 70 has strong resistance to external substances, e.g., sulfur, moisture and/or oxygen in the air. In addition, characteristics (e.g., reflectivity) of the integrated layer 70 are substantially same as that of the reflection layer 30. Furthermore, the bonding characteristic of the semiconductor device to the integrated layer 70 is enhanced as compared to that to the reflection layer 30.

In the modification of the first embodiment, the thickness of the Au flash-plated layer is set as follows. First, heat treatment conditions (i.e., heat treatment temperature and time) are determined for heat treatment in the case that the bottom of the semiconductor device 60 is bonded to the device mounting region 40a via a solder material such as AuSn etc. when mounting the semiconductor device 60 on the lead frame 1. Then, after the heat treatment under the determined heat treatment conditions, the thickness t that the Au flash-plated layer can be eliminated is obtained by experiments. Thus, the thickness t is determined such that the Au flash-plated layer is eliminated by being alloyed by interdiffusion between Au and Ag.

Effects of the First Embodiment

According to the lead frame 1 in the first embodiment of the invention, it is possible to prevent the reflection layer 30 from contacting the outside by covering the reflection layer 30 with the characteristic sustaining layer 40. By preventing the reflection layer 30 from contacting the external substances (e.g., sulfur and/or oxygen contained in the air), the reflection layer 30 can be protected from being sulfurated and/or oxidized. Thus, the lead frame 1 of the embodiment can prevent the deterioration of the characteristics of the reflection layer 30 even after long-term use.

In addition, according to the lead frame 1 in the first embodiment of the invention, it is possible to improve the bonding characteristic of the semiconductor device 60 by covering the reflection layer 30 with the characteristic sustaining layer 40 which is formed of a material containing Au. Furthermore, according to the lead frame 1 in the first embodiment, since heat generated in the semiconductor device 60 is radiated to the outside while being propagated in the characteristic sustaining layer 40, the thermal resistance property can be enhanced.

Furthermore, according to the lead frame in the modification of the first embodiment, by forming the reflection layer 30 of Ag and by forming the characteristic sustaining layer 40 of the Au flash-plated layer (Au thin film) which contacts the reflection layer 30, the reflection layer 30 can be, by alloying, integrated with the characteristic sustaining layer 40 contacting the reflection layer 30. Thereby, it is possible to prevent the deterioration of the characteristics of the reflection layer 30 even when the reflection layer 30 may contact the external substances.

Second Embodiment

Figure 4:
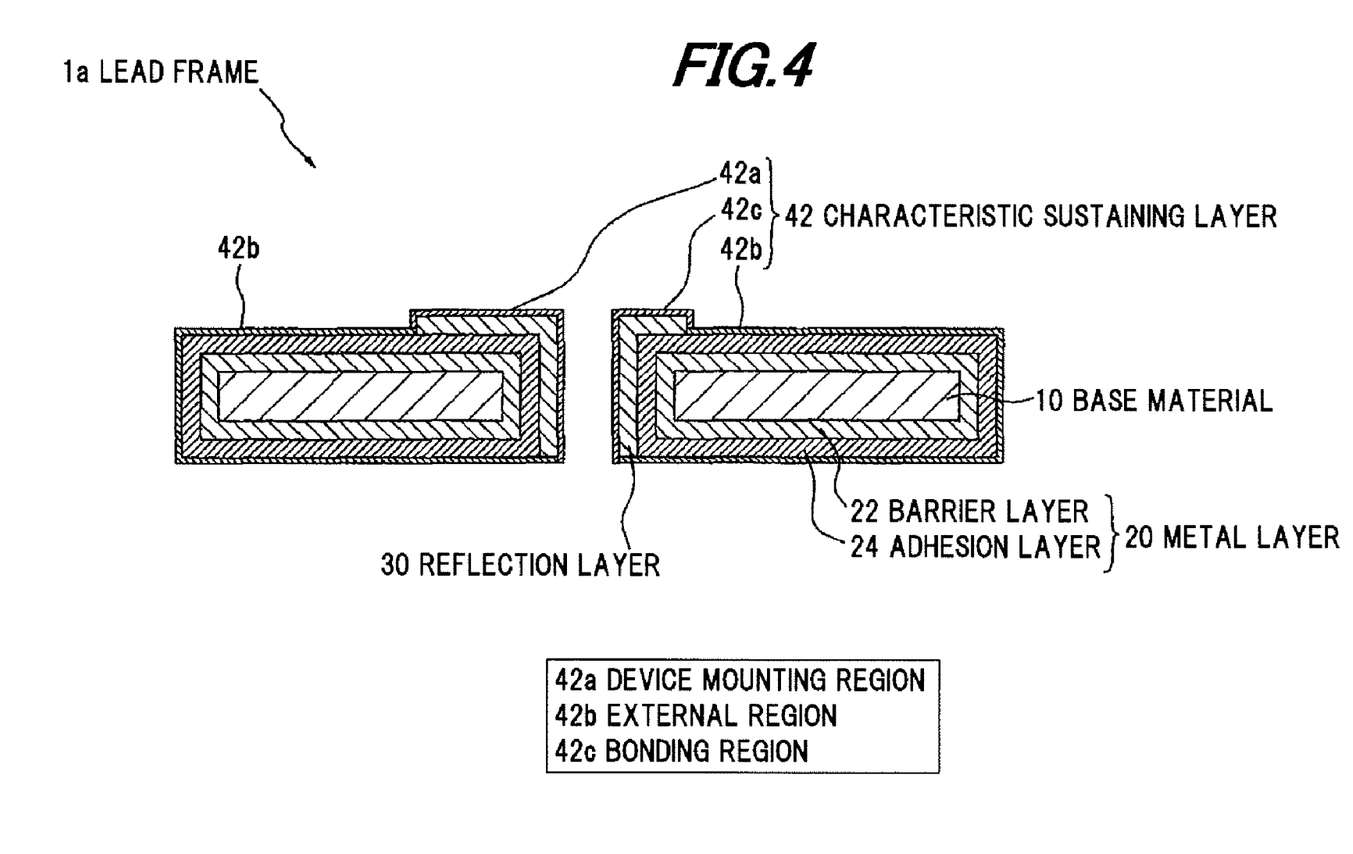
FIG. 4 is a cross sectional view showing a lead frame in a second preferred embodiment of the invention.

FIG. 4 is a cross sectional view showing the lead frame in the second embodiment of the invention.

A lead frame 1a in the second embodiment is substantially the same as the lead frame 1 in the first embodiment, except the construction of a characteristic sustaining layer 42. Thus, the detailed explanation will be omitted below except the difference.

Composition of Device Mounting Region 42a and Bonding Region 42c

The lead frame 1a in the second embodiment has a characteristic sustaining layer 42 provided at least on the reflection layer 30 so as to cover the reflection layer 30. A device mounting region 42a and a bonding region 42c of the characteristic sustaining layer 42 are formed of a material different from an external region 42b thereof. Concretely, the device mounting region 42a and the bonding region 42c in the second embodiment are formed of an inorganic or organic material that is substantially transparent to light with a wavelength of ultraviolet region to near-infrared region. In the second embodiment, the device mounting region 42a and the bonding region 42c are formed independently from the external region 42b. Alternatively, in a modification of the second embodiment, the device mounting region 42a and the bonding region 42c may be integrated with the external region 42b. In this case, the device mounting region 42a, the bonding region 42c and the external region 42b are all formed of the same material.

More concretely, the device mounting region 42a and the bonding region 42c are each formed of a fluorine-based material or a silicone-based material as an inorganic material. The fluorine-based material includes a fluorochemical surfactant or an organic fluorine compound (a compound including a perfluoro group) such as a fluorine resin or the like. The fluorochemical surfactant can be, e.g., Novec EGC-1720 from Sumitomo 3M Limited (Novec: registered trademark). The organic fluorine compound can be, e.g., R1-OCH$_2$—Rf—CH$_2$O—R2 (R1 and R2: functional groups such as acrylic group, epoxy group or epoxy acrylate group, Rf: perfluoro group).

The silicone-based material can include a silicone resin. For example, it can be a silicone resin that an alkoxy oligomer with its molecular end blocked by an alkoxysilyl group (≡Si—OR, R: organic substituent) is cured and condensed by hydrolysis. The organic substituent can include at least one selected from a methyl group, a phenyl group, an epoxy group and a mercaptan group. If it is intended to use a silicone resin without absorbing light with a wavelength in ultraviolet region, it is preferable to use the methyl group as the substituent.

The silicone-based material also can be an acrylic silicone emulsion in which the amount of a silicone resin ingredient in an active ingredient is 50% or more, an organic solvent is not substantially contained, and a molecular end thereof is a silanol group. Further, the silicone-based material can be a silicone resin-based material used as optical plastics and having a predetermined refractive index. For example, it can be a silicone resin with a refractive index of 1.3 to 1.4. Note that, the silicone resin used as optical plastics can be formed by using a sol-gel method.

The organic material can be a material that forms an organic coating by chelate reaction etc. with Ag composing the reflection layer 30. For example, it can be an aliphatic mercaptan (alkyl mercaptan, n=12-20) as a mercaptan-based material represented by a chemical formula: $CH_3(CH_2)_nSH$, or a benzotriazole derivative as a triazole-based material selected from 5-methyl-1H-benzotriazole and/or 5,6-dimethyl-1H-benzotriazole.

Production of Device Mounting Region 42a and Bonding Region 42c

The device mounting region 42a and the bonding region 42c of the characteristic sustaining layer 42 in the embodiment can be formed by dissolving, e.g., the fluorine-based material in an organic solvent, applying the organic solvent containing the fluorine-based material onto sites for the device mounting region 42a and the bonding region 42c, and removing the organic solvent. For example, the device mounting region 42a and the bonding region 42c in the embodiment may be formed as below. As an example, the process of forming the device mounting region 42a and the bonding region 42c by using the fluorine-based material will be explained below.

First, the barrier layer 22 and the adhesion layer 24 are formed on the base material 10. Then, the reflection layer 30 is formed on a part of the adhesion layer 24. Then, a lead frame with the characteristic sustaining layer 42 (i.e., the external region 42b) formed by, e.g., Au flash-plating is prepared in a region except the surface of the reflection layer 30 (lead frame preparing step). Then, the lead frame is cleaned by ultrasonic cleaning using an organic solvent such as acetone and/or isopropyl alcohol etc. (cleaning step). After cleaning, the leaf frame is dried by heating at about 100° C. for 3 to 5 minutes (first drying step).

Then, EGC-1720 (from Sumitomo 3M Limited) as the fluorine-based material is applied to the region to form the device mounting region 42a and the bonding region 42c of the lead frame (coating step). Then, the lead frame with EGC-1720 (from Sumitomo 3M Limited) applied to a predetermined region is dried by heating at 60° C. to 120° C. for 30 minutes (second drying step). Thereby, the characteristic sustaining layer 42 (i.e., the device mounting region 42a and the bonding region 42c) with a thickness of 5 nm to 10 nm is formed. Thus, the lead frame 1a provided with the characteristic sustaining layer 42 including the device mounting region 42a and the bonding region 42c formed of the fluorine-based material is formed.

The lead frame 1a thus formed and a lead frame with the reflection layer exposed are left in the air at room temperature for 315 hours. As a result, the reflection layer 30 located under the device mounting region 42a and the bonding region 42c of the lead frame 1a provided with the characteristic sustaining layer 42 does not change in reflectivity before and after being left in the air. In contrast, the reflection layer of the lead frame with the exposed reflection layer significantly decreases in reflectivity.

Instead of coating EGC-1720 onto a predetermined region, dip coating may be conducted such that a mask is formed on a region except the device mounting region 42a and the bonding region 42c of the lead frame after cleaning, the lead frame with the mask is dipped in EGC-1720 and is pulled up at a speed of 3 to 4 mm/sec (coating step). Then, the lead frame dip-coated with EGC-1720 (from Sumitomo 3M Limited) may be heated and dried at a temperature of 60° C. to 120° C. for 30 minutes to remove the mask (mask removal step). Thus, the lead frame 1a can be formed.

When the device mounting region 42a and the bonding region 42c of the characteristic sustaining layer 42 are formed of an organic material, e.g., aliphatic mercaptan, the following process can be used. First, the aliphatic mercaptan is added to liquid paraffin or polyethylene glycol. Then, a stock solution is adjusted by dissolving the aliphatic mercaptan-added liquid paraffin or polyethylene glycol in an organic solvent such as ethanol, trichloroethane etc. Then, the stock solution is coated onto a predetermined region to form the characteristic sustaining layer 42.

Effects of the Second Embodiment

The lead frame 1a of the second embodiment of the invention is formed such that at least the device mounting region 40a and the bonding region 40c are covered with the inorganic or organic material. Thereby, it is possible to prevent the reflection layer 30 from contacting the outside and to prevent the decrease in reflectivity of the reflection layer 30 as well as the sulfuration and/or oxidation (discoloration) of the reflection layer 30.

In addition, the lead frame 1a of the second embodiment is formed such that the device mounting region 40a and the bonding region 40c including a region contacting the reflector 50 are covered with the inorganic or organic material. Thereby, it can be enhanced in adhesiveness with the reflector 50 which is formed by resin molding. Thus, the reliability of the lead frame 1a can be increased.

Third Embodiment

Figure 5:
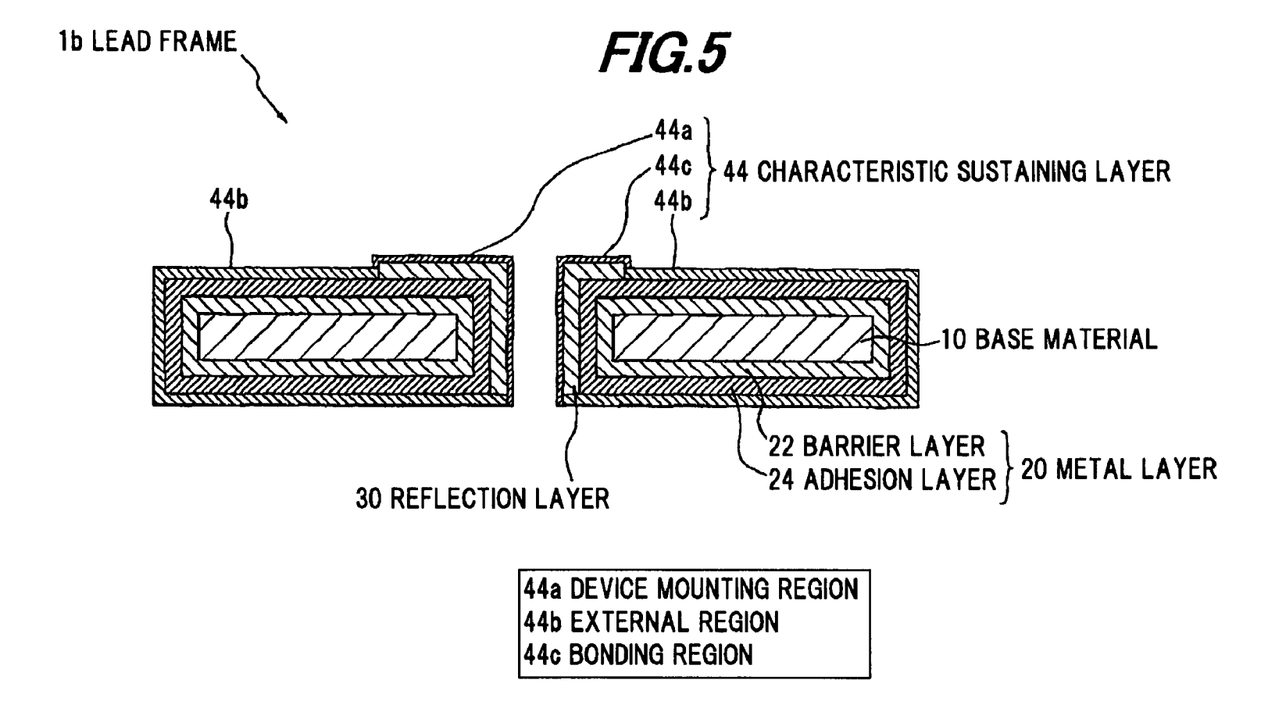
FIG. 5 is a cross sectional view showing a lead frame in a third preferred embodiment of the invention.

FIG. 5 is a cross sectional view showing a lead frame in the third preferred embodiment of the invention.

A lead frame 1b in the third embodiment is substantially the same as the lead frame 1 in the first embodiment, except a configuration of a characteristic sustaining layer 44. Thus, detailed explanation will be omitted below except the difference.

Composition of Characteristic Sustaining Layer 44

The lead frame 1b in the third embodiment has a characteristic sustaining layer 44 formed at least on the reflection layer 30 so as to cover the reflection layer 30. The thickness of a device mounting region 44a and a bonding region 44c of the characteristic sustaining layer 44 is different from that of an external region 42b thereof. For example, the thickness of the characteristic sustaining layer 44 corresponding to the device mounting region 44a and the bonding region 44c is formed to be thinner than that corresponding to the external region 44b. The device mounting region 44a and the bonding region 44c in the third embodiment are formed such that they have a thickness substantially transparent to light with a wavelength from ultraviolet region to near-infrared region.

An Au-plated layer (i.e., external region 44b) with a predetermined thickness is formed on the adhesion layer 24 such that a mask is formed on the surface of the reflection layer 30 and Au plating is provided on the surface of the adhesion layer 24. Then, the mask formed on the surface of the reflection layer 30 is removed. Then, by forming an Au flash-plated layer on the reflection layer 30, the lead frame 1b in the embodiment can be formed. Alternatively, the device mounting region 44a and the bonding region 44c of the characteristic sustaining layer 44 may be formed by using the inorganic or organic material described in the second embodiment instead of using the Au flash-plated layer formed on the reflection layer 30.

By differentiating in thickness the device mounting region 44a and the bonding region 44c from the external region 44b, the device mounting region 44a and the bonding region 44c can allow the transmission of light with a predetermined wavelength therethrough, the reflection layer 30 can be prevented from contacting the outside, and the external region 44b can have a predetermined mechanical strength. Thus, it is possible to enhance degree of design freedom of the lead frame 1b.

Fourth Embodiment

Figure 6:
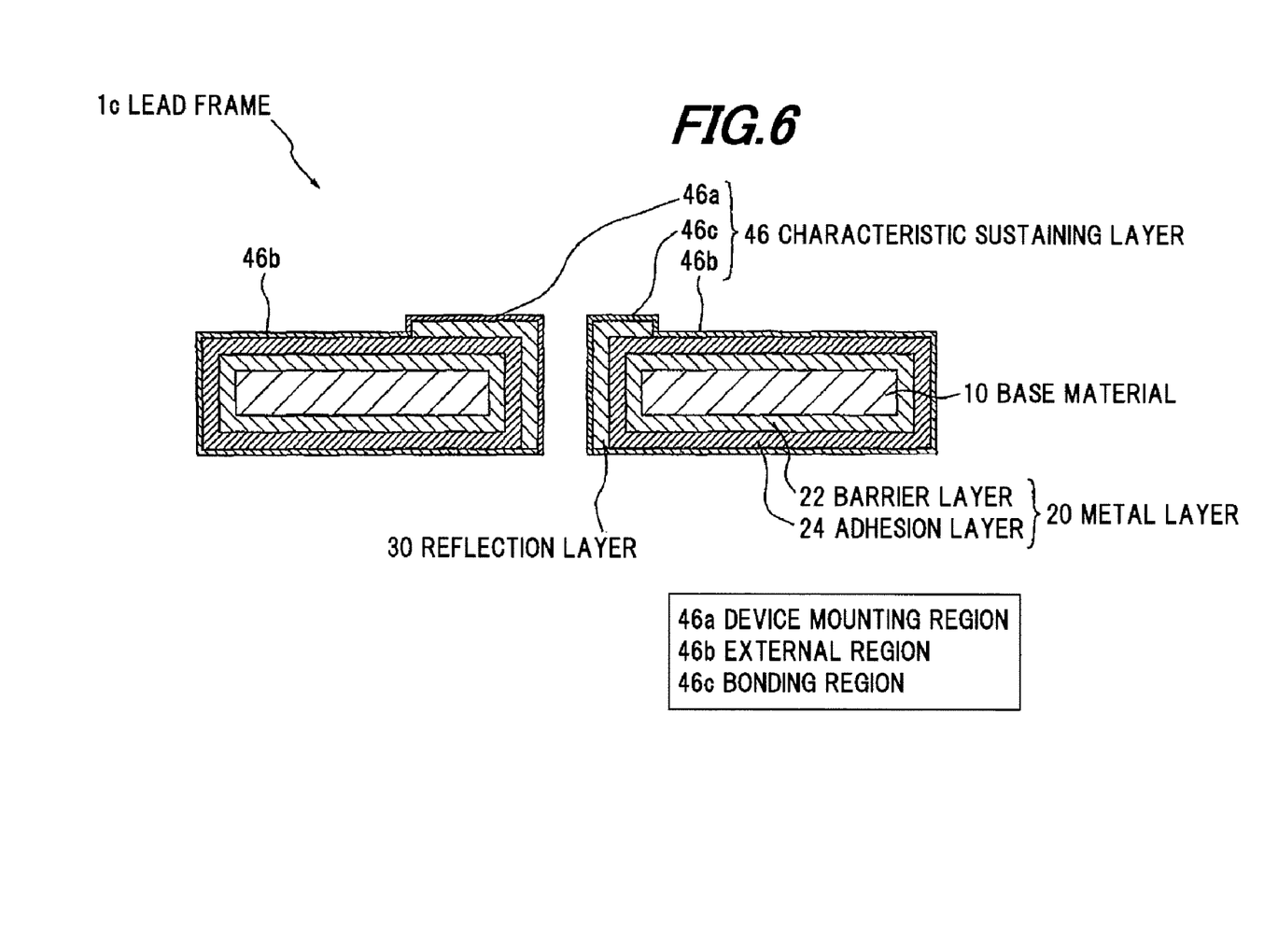
FIG. 6 is a cross sectional view showing a lead frame in a fourth preferred embodiment of the invention.

FIG. 9 is a cross sectional view showing a lead frame in the fourth preferred embodiment of the invention.

The lead frame 1c in the fourth embodiment is substantially the same as the lead frame 1 in the first embodiment, except the composition of a characteristic sustaining layer 46. Thus, detailed explanation will be omitted below except the difference.

The lead frame 1c in the fourth embodiment has the characteristic sustaining layer 46 formed at least on the reflection layer 30 so as to cover the reflection layer 30. A device mounting region 46a and a bonding region 46c of the characteristic sustaining layer 46 are each formed of a different material. The characteristic sustaining layer 46 formed as at least the device mounting region 46a is formed to have a thickness substantially transparent to light with a wavelength from ultraviolet region to near-infrared region. Meanwhile, the lead frame 1c in a modification of the embodiment is formed such that the thickness of the mounting region 46a is thinner than that of the bonding region 46c while a material forming the device mounting region 46a is same as a material forming the bonding region 46c.

The device mounting region 46a in the fourth embodiment is formed with an Au thin film formed by, e.g., Au flash plating. Alternatively, the device mounting region 46a can be formed by using the inorganic or organic material as described in the second embodiment. On the other hand, the bonding region 46c is formed by Au plating as an Au layer thicker than the characteristic sustaining layer 46 at the device mounting region 46a. For example, the lead frame 1c in the embodiment is produced such that an Au layer (i.e., the bonding region 46c) with a predetermined thickness is formed by Au plating on the surface of the reflection layer 30 except a part corresponding to the device mounting region 46a and the adhesion layer 24, and an Au thin film is formed on the surface of the reflection layer 30 corresponding to the device mounting region 46a by Au flash plating.

Modification

Figure 7:
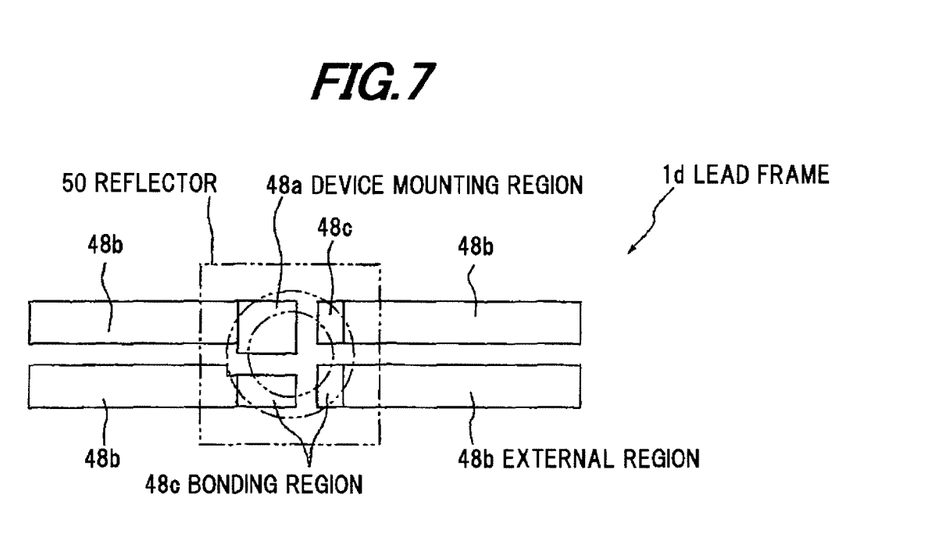
FIG. 7 is a top view showing a lead frame in a fifth preferred embodiment of the invention.

FIG. 7 is a top view showing a lead frame in a modification of the invention.

A lead frame 1d in the modification is substantially the same as the lead frames of the first to fourth embodiments, except a shape thereof in top view. Thus, the detailed explanation will be omitted below except the difference.

The lead frame 1d in the modification is formed such that a characteristic sustaining layer 48 is composed of a device mounting region 48a, plural bonding regions 48c and plural external regions 48b. For example, in the lead frame 1d in the modification, plural semiconductor devices can be mounted on the device mounting region 48a and the plural semiconductor devices can be electrically connected to the plural bonding regions 48c. In detail, a red LED for emitting light with a wavelength in red region, a green LED for emitting light with a wavelength in green region and a blue LED for emitting light with a wavelength in blue region may be mounted on the device mounting region 48a. The red LED, the green LED and the blue LED are each electrically connected to any one of the plural bonding regions 48c. Thus, the lead frame 1d in the modification can be used as a lead frame for a white LED.

Although the invention has been described, the invention according to claims is not to be limited by the above-mentioned embodiments and modifications. Further, please note that not all combination of the features described in the embodiments and the modifications are not necessary to solve the problem of the invention.

What is claimed is:

1. A lead frame for mounting a light emitting element, comprising:
   a base material;
   a reflection layer configured to reflect light emitted from the light emitting element, wherein the reflection layer is formed on apart of the base material; and
   a characteristic sustaining layer covering an exposed surface of the reflection layer and isolating the reflection layer from an outside environment, wherein the characteristic sustaining layer comprises a part configured to mount the light emitting element thereon;
   wherein:
   the reflection layer comprises Ag, and
   the characteristic sustaining layer comprises an Au thin film.

2. The lead frame according to claim 1, wherein:
   the reflection layer comprises the characteristic to exhibit a predetermined reflectivity to a wavelength of the light emitted from the light emitting element, and
   the characteristic sustaining layer prevents a decrease in the reflectivity of the reflection layer and transmits light reflected by the reflection layer.

3. The lead frame according to claim 1, wherein the characteristic sustaining layer is integrated with the reflection layer to form an alloy of Ag composing the reflection layer and Au composing the Au thin film.

4. The lead frame according to claim 1, wherein the characteristic sustaining layer comprises the Au thin film and an alloy layer formed from the Au thin film and the reflection layer.

5. The lead frame according to claim 1, wherein:
   the part of the characteristic sustaining layer comprises a device mounting region contacting the light emitting element and the characteristic sustaining layer comprises an external region formed on an outside of the device mounting region, and
   the device mounting region is formed on a part of the reflection layer.

6. The lead frame according to claim 5, wherein the device mounting region is integrated with the external region.

7. The lead frame according to claim 5, wherein the device mounting region is formed independently from the external region.

8. A light emitting device, comprising:
   the lead frame according to claim 1;
   the light emitting element mounted on the characteristic sustaining layer; and
   a sealing member for sealing the light emitting device.

9. The lead frame according to claim 1, wherein the reflection layer and the characteristic sustaining layer are formed at a separated portion separating the lead frame into first and second parts.

10. The lead frame according to claim 9, wherein the reflection layer and the characteristic sustaining layer are formed on both of an upper surface and a side surface of the lead frame.

11. The lead frame according to claim 9, wherein the reflection layer and the characteristic sustaining layer are formed at least on the first part electrically isolated from the second part contacting the light emitting element.

12. The lead frame according to claim 9, wherein the first part is to be electrically connected to the light emitting element by a wire.

13. The lead frame according to claim 1, wherein the characteristic sustaining layer covers an entirety of the exposed surface of the reflection layer.

14. The lead frame according to claim 1, wherein the reflection layer exhibits a reflectivity of about more than 95% of light with a wavelength of 400 nm to 800 nm.

15. The lead frame according to claim 1, wherein the characteristic sustaining layer is substantially transparent.

16. The lead frame according to claim 1, wherein the part of the characteristic sustaining layer is formed between the reflection layer and a bottom surface of the light emitting element.

17. A method of making a lead frame for mounting a light emitting element, comprising:
    forming a reflection layer comprising Ag configured to reflect light emitted from the light emitting element on a part of a base material; and
    forming a characteristic sustaining layer comprising Au covering an exposed surface of the reflection layer and isolating the reflection layer from an outside environment, wherein the characteristic sustaining layer comprises a part configured to mount the light emitting element thereon.

18. A lead frame for mounting a light emitting element, comprising:
    a base material;
    a barrier layer on the base material;
    an adhesion layer on the barrier layer;
    a reflection layer configured to reflect light emitted from the light emitting element, wherein the reflection layer is formed on a part of the adhesion layer; and
    a characteristic sustaining layer covering an exposed surface of the reflection layer and isolating the reflection layer from an outside environment, wherein the characteristic sustaining layer comprises a part configured to mount the light emitting element thereon;
    wherein the base material comprises Cu or a Cu-alloy, the barrier layer comprises Ni, the adhesion layer comprises Pd, the reflection layer comprises Ag, and the characteristic sustaining layer comprises Au.

19. A lead frame for mounting a light emitting element, comprising:
    a base material;
    a reflection layer configured to reflect light emitted from the light emitting element, wherein the reflection layer is formed on a part of the base material; and
    a characteristic sustaining layer covering an exposed surface of the reflection layer and isolating the reflection layer from an outside environment, wherein the characteristic sustaining layer comprises a part configured to mount the light emitting element thereon;
    wherein the characteristic sustaining layer consists essentially of Au.

20. A lead frame for mounting a light emitting element, comprising:
    a base material;
    a reflection layer configured to reflect light emitted from the light emitting element, wherein the reflection layer is formed on a part of the base material; and
    a characteristic sustaining layer covering an exposed surface of the reflection layer and isolating the reflection layer from an outside environment, wherein the characteristic sustaining layer comprises a part configured to mount the light emitting element thereon;
    wherein the characteristic sustaining layer consists of Au.

21. A lead frame for mounting a light emitting element, comprising:
    a base material;
    a reflection layer configured to reflect light emitted from the light emitting element, wherein the reflection layer is formed on a part of the base material; and
    a characteristic sustaining layer covering an exposed surface of the reflection layer and isolating the reflection layer from an outside environment, wherein the characteristic sustaining layer comprises a part configured to mount the light emitting element thereon;
    wherein the characteristic sustaining layer comprises a flash-plated Au layer.

* * * * *